United States Patent
Zhang et al.

(10) Patent No.: US 12,550,329 B2
(45) Date of Patent: Feb. 10, 2026

(54) VERTICAL MEMORY DEVICES

(71) Applicant: YANGTZE MEMORY TECHNOLOGIES CO., LTD., Wuhan (CN)

(72) Inventors: Zhong Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/929,113

(22) Filed: Oct. 28, 2024

(65) Prior Publication Data
US 2025/0056801 A1    Feb. 13, 2025

Related U.S. Application Data

(63) Continuation of application No. 18/503,430, filed on Nov. 7, 2023, now Pat. No. 12,167,605, which is a
(Continued)

(51) Int. Cl.
*H01L 27/11582* (2017.01)
*H01L 21/768* (2006.01)
(Continued)

(52) U.S. Cl.
CPC ....... *H10B 43/27* (2023.02); *H01L 21/76816* (2013.01); *H01L 21/76877* (2013.01);
(Continued)

(58) Field of Classification Search
CPC ............. H01L 27/11582; H01L 21/768; H01L 21/76877
See application file for complete search history.

(56) References Cited

U.S. PATENT DOCUMENTS 8,822,285 B2    9/2014  Hwang et al.
9,773,804 B2    9/2017  Lee
(Continued)

FOREIGN PATENT DOCUMENTS

CN    108431956 A    8/2018
CN    109119426 A    1/2019
(Continued)

OTHER PUBLICATIONS

International Search Report and Written Opinion issued Jun. 2, 2020 in PCT/CN2019/102332, filed Aug. 23, 2019.
(Continued)

*Primary Examiner* — Errol V Fernandes
(74) *Attorney, Agent, or Firm* — BAYES PLLC

(57) ABSTRACT

A semiconductor device includes a stack including gate layers and insulating layers alternately stacked along a first direction, channel structures located in an array region of the stack, a first staircase located at a first section in a connection region of the stack, the connection region and the array region arranged in a second direction perpendicular to the first direction, a second staircase located at a second section in the connection region of the stack, and an intermediate staircase located at the first section and disposed between the first staircase and the second staircase in the second direction. The intermediate staircase includes intermediate group stair steps ascending in the second direction. The intermediate staircase has a first sidewall and a second sidewall in the second direction. The second sidewall is closer to the second staircase than the first sidewall. The second sidewall is parallel to the first direction. The intermediate group stair steps of the intermediate staircase face the first staircase.

20 Claims, 15 Drawing Sheets

Related U.S. Application Data continuation of application No. 18/156,467, filed on Jan. 19, 2023, now Pat. No. 11,864,388, which is a continuation of application No. 17/448,307, filed on Sep. 21, 2021, now Pat. No. 11,812,614, which is a continuation of application No. 16/684,844, filed on Nov. 15, 2019, now Pat. No. 11,171,154, which is a continuation of application No. PCT/CN2019/102332, filed on Aug. 23, 2019.

(51) Int. Cl.
| | |
|---|---|
| *H01L 23/522* | (2006.01) |
| *H01L 23/528* | (2006.01) |
| *H10B 41/27* | (2023.01) |
| *H10B 41/35* | (2023.01) |
| *H10B 43/27* | (2023.01) |
| *H10B 43/35* | (2023.01) |
| *H10D 64/01* | (2025.01) |

(52) U.S. Cl.
CPC ...... *H01L 23/5226* (2013.01); *H01L 23/5283* (2013.01); *H10B 41/27* (2023.02); *H10B 41/35* (2023.02); *H10B 43/35* (2023.02); *H10D 64/017* (2025.01)

(56) References Cited

U.S. PATENT DOCUMENTS

| | | | |
|---|---|---|---|
| 10,049,744 | B2 | 8/2018 | Jeong et al. |
| 10,128,268 | B2 | 11/2018 | Lee |
| 10,134,747 | B2 | 11/2018 | Lee |
| 10,224,341 | B2 | 3/2019 | Kim et al. |
| 10,269,620 | B2 | 4/2019 | Yu et al. |
| 10,482,964 | B2 | 11/2019 | Jeong et al. |
| 10,566,347 | B2 | 2/2020 | Lee |
| 2006/0113663 | A1 | 6/2006 | Yuan et al. |
| 2009/0090950 | A1 | 4/2009 | Forbes et al. |
| 2010/0112753 | A1 | 5/2010 | Lee |
| 2011/0049594 | A1 | 3/2011 | Dyer et al. |
| 2013/0161821 | A1 | 6/2013 | Hwang et al. |
| 2014/0191388 | A1 | 7/2014 | Chen |
| 2014/0284675 | A1 | 9/2014 | Watanabe |
| 2015/0228623 | A1 | 8/2015 | Oh et al. |
| 2016/0005696 | A1 | 1/2016 | Jeong et al. |
| 2016/0268166 | A1 | 9/2016 | Nakajiima |
| 2017/0033117 | A1 | 2/2017 | Lee |
| 2017/0141032 | A1 | 5/2017 | Lee |
| 2017/0200676 | A1 | 7/2017 | Jeong et al. |
| 2017/0236746 | A1 | 8/2017 | Yu et al. |
| 2017/0317088 | A1 | 11/2017 | Lee |
| 2017/0345844 | A1 | 11/2017 | Lee |
| 2018/0026047 | A1 | 1/2018 | Park et al. |
| 2018/0166384 | A1 | 6/2018 | Lee |
| 2018/0168391 | A1 | 6/2018 | Eriksson |
| 2018/0174661 | A1 | 6/2018 | Kim et al. |
| 2018/0182771 | A1 | 6/2018 | Costa et al. |
| 2018/0182775 | A1 | 6/2018 | Kim et al. |
| 2018/0277517 | A1 | 9/2018 | Kim et al. |
| 2018/0315479 | A1 | 11/2018 | Lee |
| 2018/0336950 | A1 | 11/2018 | Jeong et al. |
| 2019/0043887 | A1 | 2/2019 | Lee |
| 2019/0051655 | A1 | 2/2019 | Lee |
| 2019/0081069 | A1 | 3/2019 | Lu et al. |
| 2019/0157297 | A1 | 5/2019 | Kim et al. |
| 2019/0164983 | A1 | 5/2019 | Hu et al. |
| 2019/0244892 | A1 | 8/2019 | Zhu et al. |
| 2019/0312051 | A1 | 10/2019 | Park et al. |
| 2019/0355740 | A1 | 11/2019 | Hong et al. |
| 2020/0075101 | A1 | 3/2020 | Jeong et al. |
| 2020/0143888 | A1 | 5/2020 | Rabkin et al. |

FOREIGN PATENT DOCUMENTS

| | | | |
|---|---|---|---|
| CN | 109155301 | A | 1/2019 |
| CN | 109411476 | A | 3/2019 |
| CN | 110192269 | A | 8/2019 |
| CN | 109496354 | B | 1/2020 |
| CN | 109983577 | B | 12/2021 |
| JP | 5-55513 | | 3/1993 |
| JP | 8-186235 | | 7/1996 |
| JP | 8-227980 | | 9/1996 |
| JP | 2016-157832 | A | 1/2016 |
| KR | 10-2012-0048415 | | 5/2012 |
| KR | 10-2017-0014757 | A | 2/2017 |
| KR | 10-2017-0083948 | A | 7/2017 |
| KR | 10-2018-0007811 | A | 1/2018 |
| TW | 1667774 | B | 8/2019 |
| WO | 2018/061846 | A1 | 9/2018 |
| WO | 2020/211332 | A1 | 10/2020 |

OTHER PUBLICATIONS

Australian Office Action issued on Jan. 13, 2022 in Patent Application No. 2019464174, 4 pages.
Extended European Search Report issued on Jun. 10, 2022 in European Patent Application No. 19943654.4, 10 pages.
Extended European Search Report issued on Oct. 20, 2022 in European Patent Application No. 19935559.5, 11pages.
Korean Office Action issued Oct. 19, 2022 in Korean Application No. 10-2021-7038759, 7 pages.
Japanese Office Action issued Oct. 17, 2022 in Japanese Application No. 2021-546332, 9 pages.
Japanese Office Action issued Nov. 7, 2022 in Japanese Application No. 2021-559590, 6 pages.
Korean Office Action issued Oct. 5, 2022 in Korean Application No. 10-2021-7002103, 12 pages.
Supplementary European Search Report issued Nov. 21, 2022 in European Application No. 20924973.9, 8 pages.
Korean Office Action issued Nov. 21, 2022 in Korean Application No. 10-2021-7003209, 7 pages.
Japanese Office Action issued Nov. 30, 2022 in Japanese Application No. 2021-570493, 6 pages.
Korean Office Action issued Nov. 10, 2022 in Korean Application No. 10-2021-7004384, 7 pages.
Japanese Office Action issued Nov. 22, 2022 in Japanese Application No. 2021-523013, 4 pages.
Singapore Search Report issued on Feb. 20, 2023 in the Singapore Application No. 11202112524S, 2 pages.

VERTICAL MEMORY DEVICES

CROSS-REFERENCE TO RELATED APPLICATIONS

This application is a continuation of U.S. patent application Ser. No. 18/503,430, filed on Nov. 7, 2023, which is a continuation of U.S. patent application Ser. No. 18/156,467, filed on Jan. 19, 2023 (now U.S. Pat. No. 11,864,388), which is a continuation of U.S. patent application Ser. No. 17/448,307, filed on Sep. 21, 2021 (now U.S. Pat. No. 11,812,614), which is a continuation of U.S. patent application Ser. No. 16/684,844, filed on Nov. 15, 2019 (now U.S. Pat. No. 11,171,154), which is a continuation of International Application No. PCT/CN2019/102332, filed on Aug. 23, 2019, all of which are incorporated herein by reference in their entireties.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes an array region (also referred to as core region) and a staircase region. The array region includes a stack of alternating gate layers and insulating layers. The stack of alternating gate layers and insulating layers is used to form memory cells that are stacked vertically in the array region. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes gate layers and insulating layers that are parallel to each other and are stacked alternatingly along a first direction and form a stack. The semiconductor device includes an array of channel structures that are formed in an array region of the stack. The array region can be arranged in a second direction perpendicular to the first direction. Further, the semiconductor device includes a first staircase formed at a first section in a connection region of the stack, and a second staircase formed at a second section in the connection region of the stack. The connection region can be arranged in the second direction. In addition, the semiconductor device includes a dummy staircase formed at the first section in the connection region of the stack and disposed between the first staircase and the second staircase. The dummy staircase can include dummy group stair steps descending in the second direction, and dummy division stair steps descending in a third direction and a fourth direction that are perpendicular to the second direction and the first direction. The third direction and the fourth direction can be opposite to each other.

In some embodiments, the first staircase can be positioned over the second staircase, the first staircase can include first group stair steps descending in the second direction and first division stair steps descending in the third direction and the fourth direction, and the second staircase can include second group stair steps descending in the second direction and second division stair steps descending in the third direction and the fourth direction. For example, a height difference of two consecutive first group stair steps of the first group stair steps in the first direction can be equal to a height of N pairs of the gate layers and the insulating layers in the first section, a height difference of two consecutive first division stair steps of the first division stair steps in the first direction can be equal to a height of one pair of the gate layer and the insulating layer in the first section, and the N can be greater than one. As another example, the dummy staircase can be a same height as the first staircase, and the dummy staircase can be positioned over the second staircase.

In some embodiments, a height difference of two consecutive second group stair steps of the second group stair steps in the first direction can be equal to a height of N pairs of the gate layers and the insulating layers in the second section, and a height difference of two consecutive second division stair steps of the second division stair steps in the first direction can be equal to a height of one pair of the gate layer and the insulating layer in the second section. For example, corresponding group stair steps of the first group stair steps in the first staircase and the second group stair steps in the second staircase can be of a same height.

In some embodiments, a height difference of two consecutive dummy group stair steps of the dummy group stair steps in the first direction can be equal to the height of the N pairs of the gate layers and the insulating layers in the first section.

In some embodiments, each first group stair step of the first group stair steps can be formed of N first division stair steps and each second group stair step of the second group stair steps is formed of N second division stair steps.

In an embodiment, each of the first group stair steps can correspond to N respective first division stair steps, and each of the second group stair steps can correspond to N respective second division stair steps.

In some embodiments, the semiconductor device can further include a third staircase formed of a third section in the connection region of the stack that corresponds to gate top select transistors in the channel structures.

In some embodiments, the first section in the connection region of the stack and the second section in the connection region of the stack can have a same number of gate layers.

In an embodiment, the semiconductor device can further include first contact structures formed on the first staircase, the first contact structures being connected to the gate layers at the first section in the connection region of the stack. In another embodiment, the semiconductor device can further include second contact structures formed on the second staircase, the second contact structures being connected to the gate layers at the second section in the connection region of the stack. In some embodiments, no contact structures are formed on the dummy staircase.

Aspects of the present disclosure also provide another semiconductor device. For example, the semiconductor device can include gate layers and insulating layers that are parallel to each other and stacked alternatingly along a first direction and form a stack, an array of channel structures being formed in an array region of the stack, a first staircase formed at a first section in a connection region of the stack, a second staircase formed at a second section in the connection region of the stack, and first contact structures formed on the first staircase and being connected to the gate layers at the first section in the connection region of the stack. The array region can be arranged in a second direction perpendicular to the first direction. The connection region can be arranged in the second direction. A first one and a second one of the first contact structure can neighbor to each other in the second direction and have different lengths extending in the first direction. The first one and a third one of the first contact structures can neighbor to each other in a third direction the second direction and the first direction and have different lengths extending in the first direction.

In some embodiments, the semiconductor device can further include second contact structures formed on the second staircase and being connected to the gate layers at the second section in the connection region of the stack. For example, first some of the first contact structures arranged in a row in the third direction can be of a same number as second some of the first contact structures arranged in the row in the third direction, and third some of the first contact structures arranged in a row in the fourth direction are of a same number as fourth some of the second contact structures arranged in the row in the fourth direction.

In some embodiments, the first one and a fourth one of the first contact structures can neighbor to each other in a fourth direction perpendicular to the second direction and opposite to the third direction, and have different lengths extending in the first direction. In an embodiment, the third one and the fourth one of the first contact structures can have the same length.

In some embodiments, the semiconductor device can further include a dummy staircase formed at the first section and disposed between the first staircase and the second staircase.

In some embodiments, the first section in the connection region of the stack and the second section in the connection region of the stack can have a same number of the gate layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
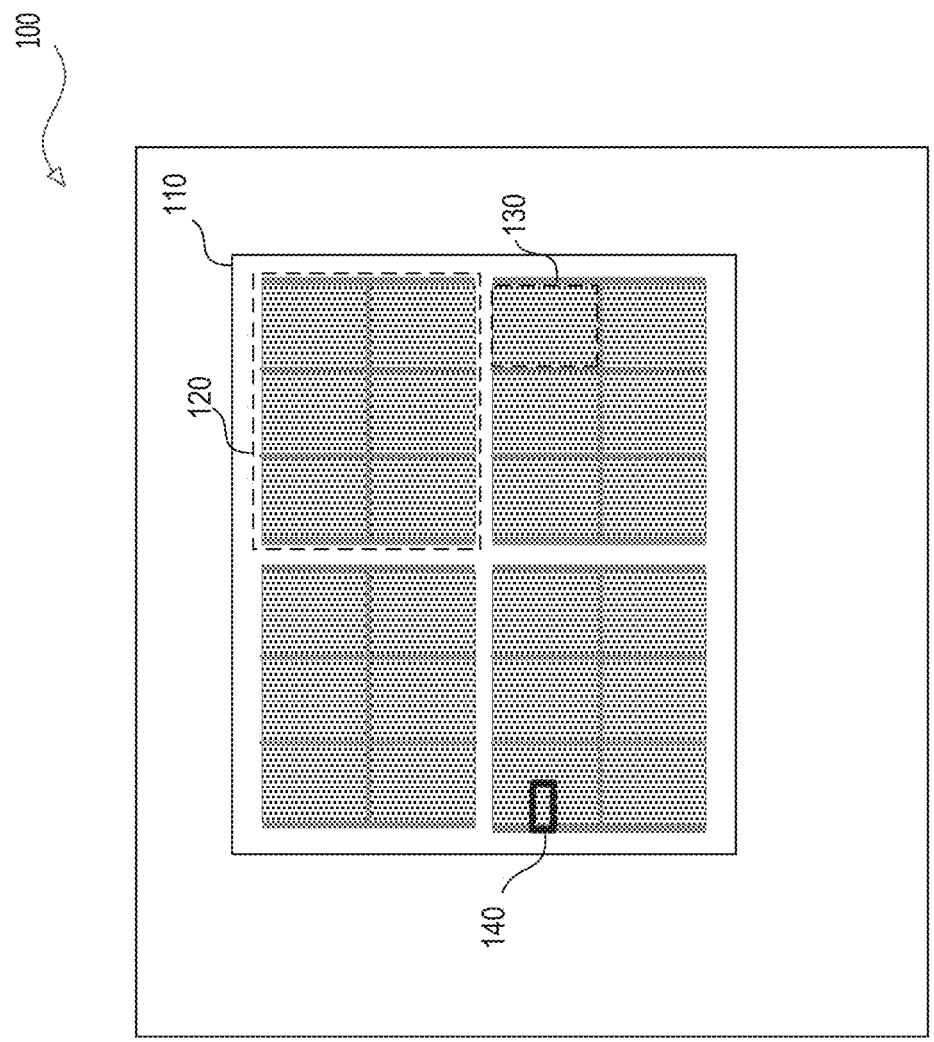
FIG. 1 shows a top-down view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) semiconductor memory devices can be formed on a substrate that includes an array region (also referred to as core region in some examples) for forming an array of memory cells and a connection region for forming connections to the memory cells. For example, the memory cells are formed in the array region as an array of vertical memory cell strings. The vertical memory cell strings are formed of gate layers and insulating layers that are stacked alternatingly. At the connection region, the stack of gate layers and the insulating layers are patterned into stair steps to provide contact pad regions for connecting the gate layers of the memory cells to word lines.

According to some examples, trim-etch process is used to form stair steps. The trim-etch process repetitively performs a trim step and an etch step based on a mask layer. During the trim step, the mask layer is trimmed to additionally expose a new step region on a stack of alternatingly stacked (sacrificial) gate layers and insulating layers. During the etch step, the stack is etched based on the mask layer to create a new step. In some examples, the trim-etch process is performed using reactive-ion etching and has a relatively low productivity, such as a relatively low wafer per hour (WPH), and trim-etch process can be high cost process for 3D memory device fabrication. In addition, when the number of stair steps is relatively large, to etch the lower stair steps, the upper stair steps and the lower stair steps have relatively large height difference. Because of the large height difference, thicker mask layer, such as thicker photoresist layer is required for the trim-etch process for the lower stair steps, and the requirement of thicker mask layer can cause, for example, difficulties in lithography process.

Generally, stair steps are formed of treads and risers. In an example, a tread is the part that is disposed horizontally between a top edge of a lower riser and a bottom edge of an upper riser, and a riser is the part that is disposed vertically between an inner edge of a lower tread and an outer edge of an upper tread. The tread is the part that can be configured into a contact pad for one or more contact structures to land on. The riser is the sidewall of a stack of layers, such as alternatingly disposed (sacrificial) gate layers and insulating layers. In some examples, a stair step is composed of a tread and a lower riser of the tread. The stair step is measured by depth and width of the tread and height of the lower riser. The depth of the tread is the distance from the outer edge to the inner edge of the tread. The width of the tread is the distance from one side of the tread to the other side. The height of the riser is the vertical distance of the sidewall between the lower tread and the current tread. In the present disclosure, the height of the riser can be measured in term of layer pairs. For example, a layer pair is a thickness sum of a (sacrificial) gate layer and an insulating layer. In some examples, when a stair step has a height of multiple layer pairs, such as four layer pairs, five layer pairs, six layer pairs, the stair step is referred to as a group stair step; when a stair step has a height of one layer pair, the stair step is referred to as a division stair step.

According to some aspects of the disclosure, the stack of alternatingly disposed gate layers and the insulating layers can be divided into sections. Each section of the stack is further divided into groups. Each group is then divided into divisions. Each division includes a layer pair. In some embodiments, the stair steps to the different sections can be formed at the same time (e.g., in the same trim-etch cycles), and then chop processes are used to remove layers and shift stair steps of the different sections to the appropriate section layers. Thus, the total number of trim-etch cycles can be reduced. For example, when two sections are used, the total number of the trim-etch cycles can be reduced by half, and the height difference of the upper stair steps to the lower stair steps in the trim-etch process can be reduced by half for example. In another example, when three sections are used, the total number of trim-etch cycles can be reduced by ⅔, the height difference of the upper stair steps to the lower stair steps in the trim-etch process can be reduced by ⅔. Because the height difference of the upper stair steps to the lower stair steps in the trim-etch process is reduced, the trim-etch process can be performed with case. Because the total number of trim-etch cycles is reduced, the processing efficiency is improved.

FIG. 1 shows a top-down view of a semiconductor device 100 according to some embodiments of the disclosure. The semiconductor device 100 includes a memory portion 110 that are formed of three-dimensional (3D) memory cells. The memory portion 110 can include one or more memory planes 120, and each of memory planes 120 can include a plurality of memory blocks 130. In some examples, concurrent operations can take place at the memory planes 120. In some embodiments, each of the memory blocks 130 is the smallest unit to carry out erase operations. In the FIG. 1 example, the memory portion 110 includes four memory planes 120 and each of the memory planes 120 includes six memory blocks 130. Each of the memory blocks 103 can include a plurality of memory cells, and each memory cell can be addressed through interconnections, such as bit lines and word lines. In some examples, the bit lines and word lines can be laid out perpendicularly, forming an array of metal lines. For example, the word lines extend in the X direction, and the bit lines extend in the Y direction.

Further, each memory block 130 can be divided into block portions 140 according to stair division patterns. The block portions 140 have identical or equivalent stair division patterns. The details of the block portions 140 will be described with reference to FIG. 2-FIG. 5.

It is noted that the semiconductor device 100 can be any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

It is also noted that, the semiconductor device 100 can include other suitable circuitry (not shown), such as logic circuitry, power circuitry, and the like that is formed on the same substrate, or other suitable substrate, and is suitably coupled with the memory portion 110. Generally, the memory portion 110 includes the memory cells and peripheral circuitry (e.g., address decoder, driving circuits, sense amplifier and the like).

Figure 2:
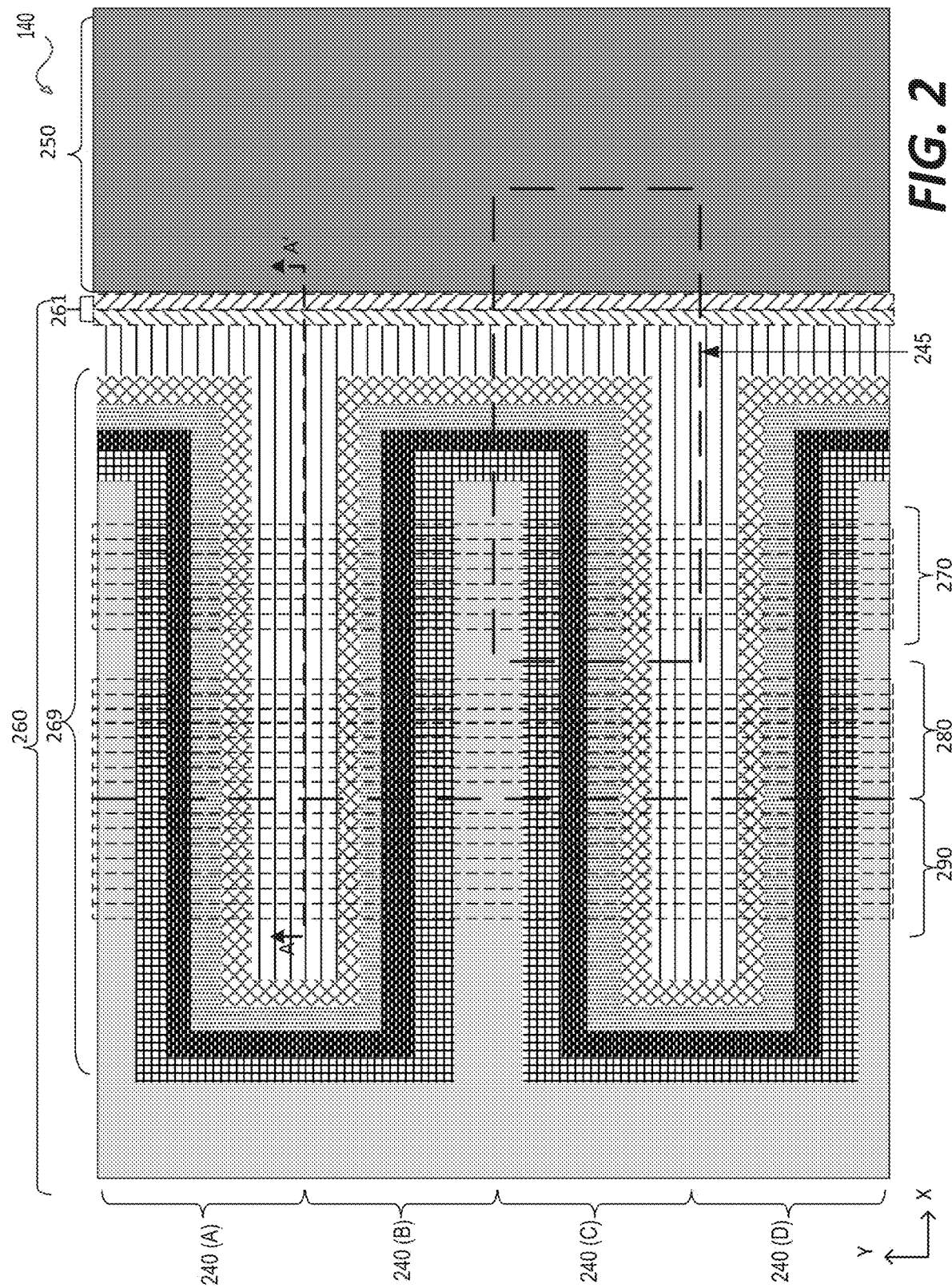
FIG. 2 shows a top-down view of a block portion in the semiconductor device according to some embodiments of the disclosure.
Figure 3:
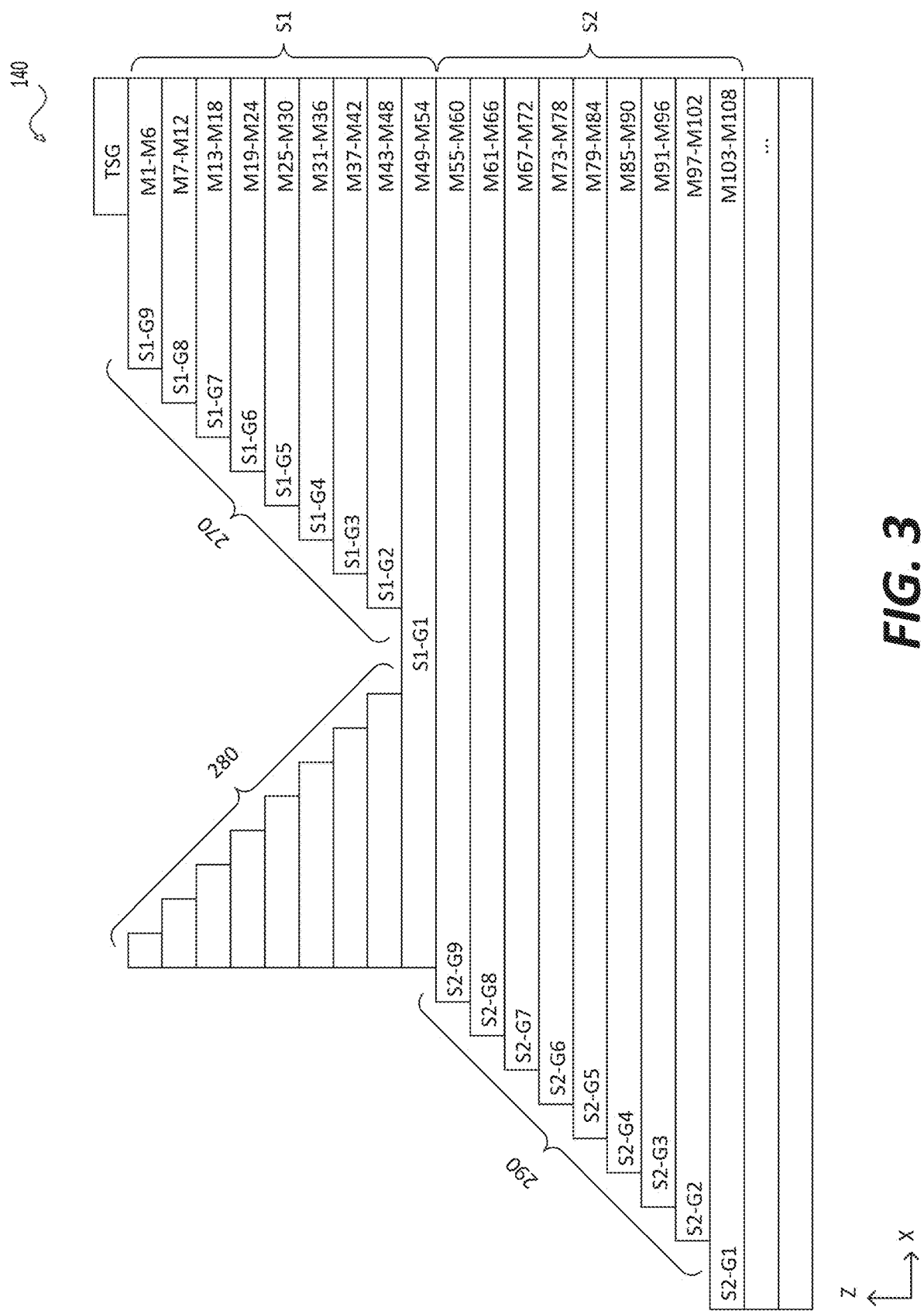
FIG. 3 shows a cross-sectional view of the block portion according to some embodiments of the disclosure.
Figure 4:
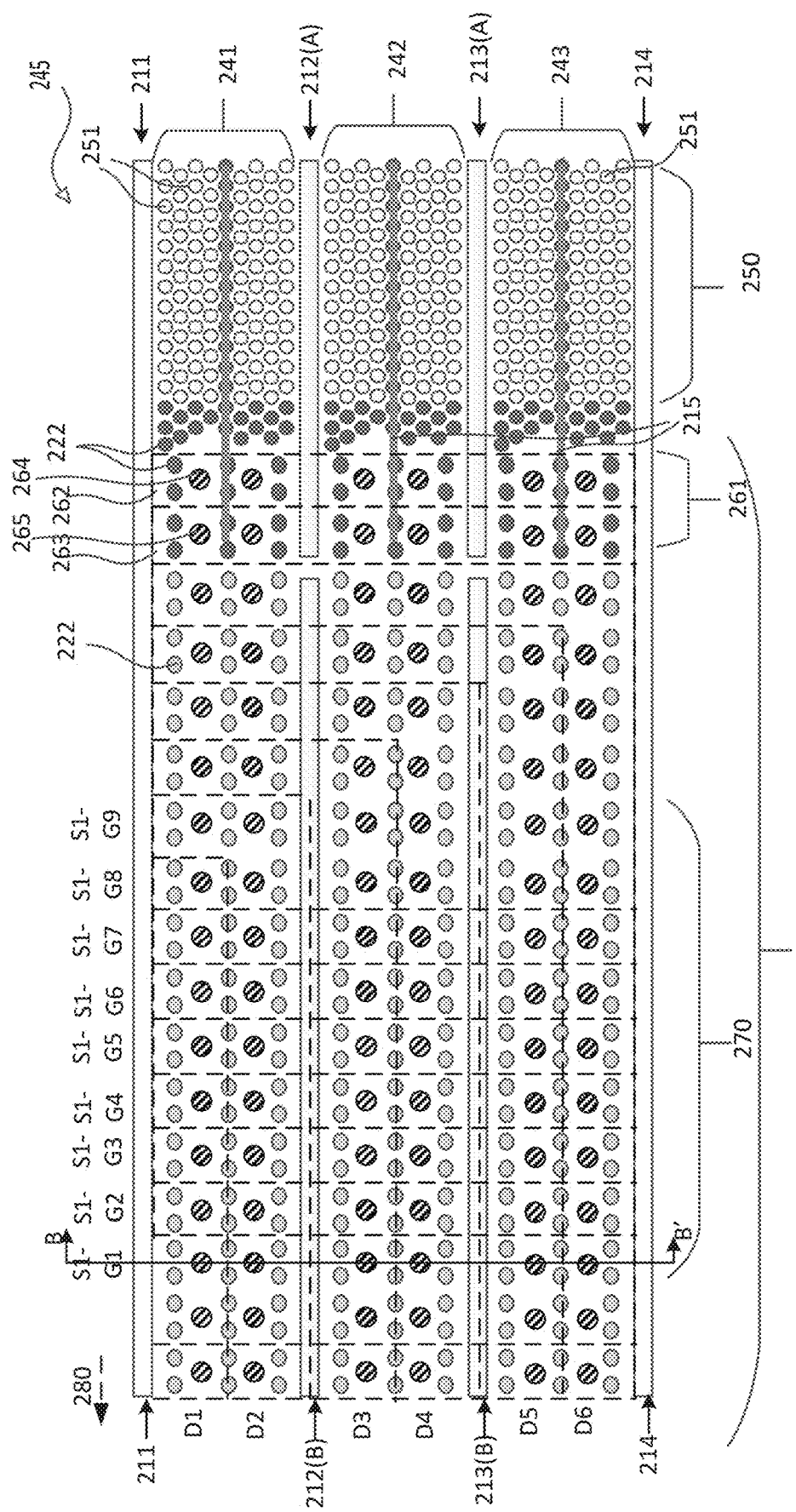
FIG. 4 shows a close up view of a portion in the block portion according to some embodiments of the disclosure.
Figure 5:
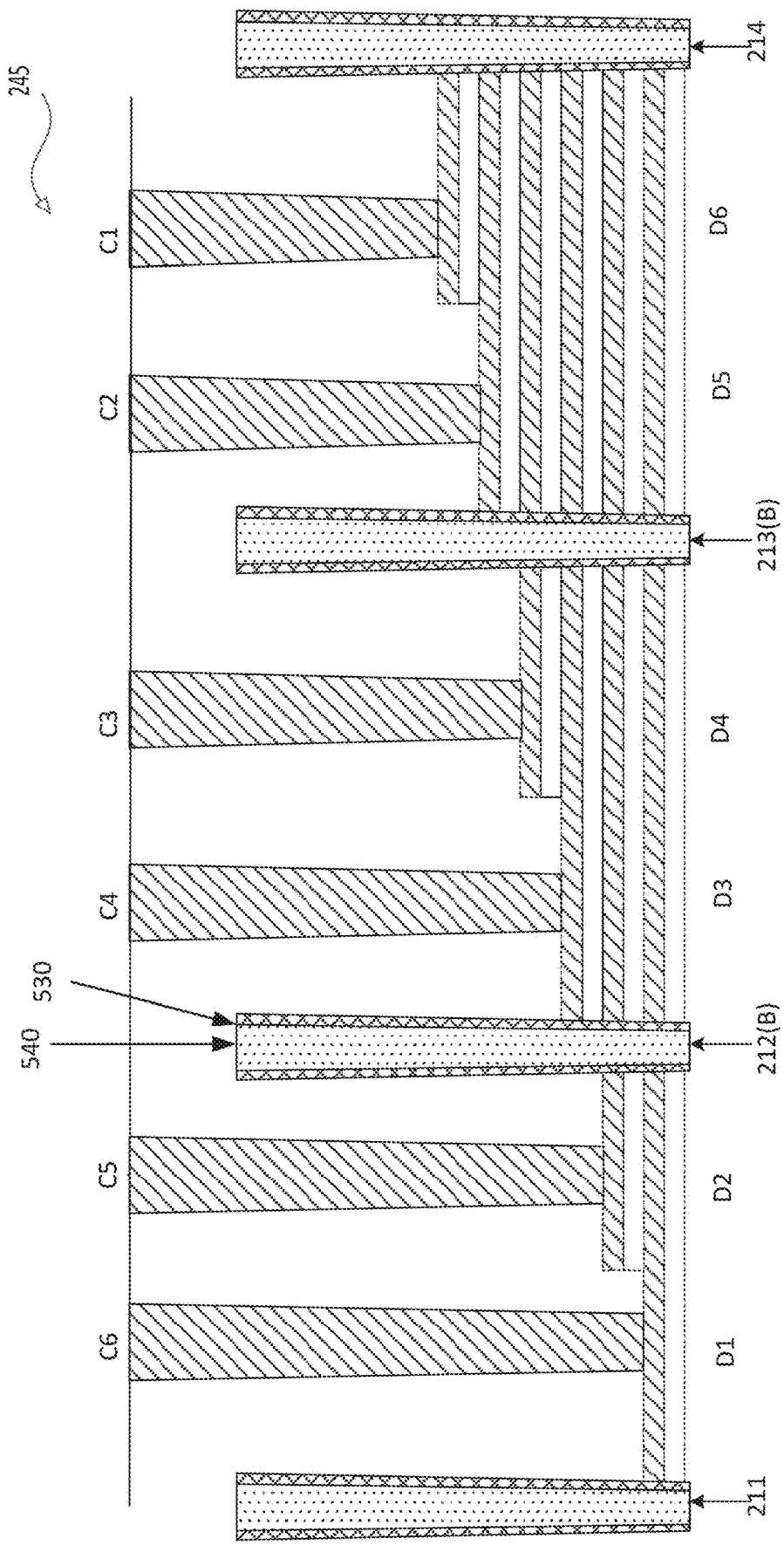
FIG. 5 shows a cross-sectional view of the portion according to some embodiments of the disclosure.

FIG. 2 shows a top-down view of a block portion 140 according to some embodiments of the disclosure, FIG. 3 shows a cross-sectional view of the block portion 140 at line A-A', FIG. 4 shows a top down view of details of a portion 245 in the block portion 140, and FIG. 5 shows a cross-sectional view of the portion 245 at line B-B'. In some examples, the top-down views in FIG. 2 and FIG. 4 are views in X-Y plane, the cross-sectional view in FIG. 3 is a view in X-Z plane, and the cross-sectional view in FIG. 5 is a view in Y-Z plane.

In the FIG. 2 and FIG. 3 example, the block portion 140 includes portions 240(A)-240(D) that have identical patterns or mirrored patterns for stair divisions, and the portions 240(A)-240(D) are referred to as stair division pattern (SDP) portions 240(A)-(D). Each SDP portion 240 includes an array region 250 and a connection region 260. The array region 250 includes an array of memory strings 251 (as shown in FIG. 4), and each memory string 251 includes a plurality of stacked memory cells connected in series with one or more top select transistors and one or more bottom select transistors. The connection region 260 includes a top select gate (TSG) connection region 261, a memory cell gate (MCG) connection region 269. The TSG connection region 261 includes a staircase structure and contact structures for connecting metal wires to the gates of the top select transistors to control the top select transistors. The MCG connection region 269 includes staircase structures and contact structures for connecting word lines to the gates of the memory cells.

It is noted that, the connection region 260 may also include a bottom select gate (BSG) connection region (not shown) that includes a staircase structure and contact structures for connecting metal wires to the gates of the bottom select transistors to control the bottom select transistors.

According to some aspects of the disclosure, the MCG connection region 269 is configured according to a multilevel staircase architecture, such as a three-level staircase architecture. As shown in FIGS. 2-5 example, each memory string 251 includes 108 memory cells, and the three-level stair architecture can be used to provide connections between word lines and the gates of the 108 memory cells in each memory string. For example, the 108 memory cells of a memory string 251 are referred to, in a consecutive order, as M1-M108 with M1 being the first memory cell next to the top select transistors, and M108 being the last one in the sequence. The 108 memory cells are divided into two sections, such as a first section of M1-M54 and a second section of M55-M108. Memory cells in each section are grouped into nine groups, and each group includes six consecutive memory cells.

It is noted that, in some embodiments, the strings of memory cells in an array are formed in a stack of alternatingly disposed gate layers and insulating layers. The gate layers form gates of the top select transistors, the memory cells (such as M1-M108 in a string) and the bottom select transistor(s). In some contexts, M1-M108 are used to refer to the gate layers (sometimes sacrificial gate layers) for the corresponding memory cells.

Specifically, in some embodiments, the three-level staircase architecture includes a section level, a group level and a division level. At the section level, in the FIG. 2-5 example, the three-level staircase architecture includes a first staircase section 270 for providing connections to the first section (S1) of M1-M54, and includes a second staircase section 290 for providing connections to the second section (S2) of M55-M108. At the group level, each staircase section includes nine group stair steps G1-G9, and each group stair step has a height of six layer pairs. At the division level, each group stair step includes 6 division stair steps D1-D6, and each division stair step has a height of one layer pair. In some examples, the group stair steps G1-G9 in each staircase section go up/down in a first direction, such as in X direction (or −X direction). Further, in some examples, division stair steps D1-D6 that go up/down in a second direction, such as Y direction (or −Y direction) that is perpendicular to the first direction.

Additionally, in the FIGS. 2-5 example, the MCG connection region 269 includes a dummy staircase section 280 that is disposed between the first staircase section 270 and the second staircase section 290.

In some embodiments, the first staircase section 270, the second staircase section 290 and the dummy staircase 280 are formed by the same trim-etch process, thus the first and second staircase sections 270 and 290 and the dummy staircase 280 are of similar group stair steps. For example, the section staircases 270 and 290 and the dummy staircase 280 have the same number of group stair steps, and corresponding group stair steps are of the same group stair step height and the same group stair step depth. The first and second staircase sections 270 and 290 have the same step-down direction, and the step-down direction of the dummy staircase 280 is the opposite direction of the step-down direction of the first and second staircase sections 270 and 290.

According to some aspects of the disclosure, a chop process is used to shift the second staircase section 290 down (e.g., −Z direction) to appropriate layers. In the FIGS. 2-5 example, the first staircase section 270 and the dummy staircase section 280 are disposed with stair steps formed in the layers for the memory cells M1-M54, and the second staircase section 290 is disposed with stair steps formed in the layers for the memory cells M55-M108.

It is noted that, while in the FIGS. 2-5 example, the three-level staircase architecture includes two staircase sections, the number of staircase sections in the three-level staircase architecture should not be limited and can be any suitable number, such as three, four, five and the like. It is noted that, while in the FIGS. 2-5 example, each staircase section includes 9 group stair steps, the number of group stair steps in a staircase section should not be limited and can be any suitable number, such as six, seven, eight, ten and the like. It is noted that, while in the FIGS. 2-5 example, each group stair step includes 9 division stair steps, the number of division stair steps in a group stair step should not be limited and can be any suitable number, such as two, three, four, five, seven and the like.

In some embodiments, the gate-last fabrication technology is used, thus slit structures are formed to assist the removal of sacrificial gate layers, and the formation of the real gates. In the FIGS. 2-5 example, slit structures 211, 212(A), 212(B), 213(A), 213(B) and 214 are formed in the SDP portion 240(C) as shown in FIG. 4. The slit structures 211, 212(A), 212(B), 213(A), 213(B) and 214 extend in the X direction, and parallel to each other. The slit structures 211 and 214 separate the SDP portion 240(C) from neighboring SDP portions 240(B) and 240(D) in an example. The slit structures 212(A) and 213(A) are disposed in the array region 250 and can divide the array of memory cell strings in the SDP portion 240(C) into three finger structures 241, 242 and 243. The slit structures 212(B) and 213(B) are disposed in the connection region 260 and can divide the connection region 260 into multiple portions.

In an example, the slit structures 211 and 214 are continuous slit structures that are filled with insulating layers to electrically insulate the gate layers of the SDP portion 240(C) from neighboring SDP portions 240(B) and 240(D) for example.

In some examples, the number of the slit structures in connection region 260 is same as the number of slit structures in the array region 250. In the FIGS. 2-5 example, the slit structures 212(B) and 213(B) are aligned with the slit structures 212(A) and 213(A). However, the slit structures 212(B) and 213(B) are broken from the slit structures 212(A) and 213(A) and are not continuous parts of the slit structures 212(A) and 213(A), thus the gate layers in the three fingers 241-243 are connected.

It is noted, in another example, the slit structures 212(B) and 213(B) are not aligned with the slit structures 212(A) and 213(A). In another example, the number of slit structures in the connection region 260 is not the same as the number of slit structures in the array region 250.

In some embodiments, at least some slit structures can function as the common source contact for an array of memory strings 251 in the array regions 250.

In the FIGS. 2-5 example, and as shown in FIG. 4, top select gate cuts 215 can be disposed in the middle of each finger portion to divide a top select gate (TSG) layer of the memory finger into two portions, and thereby can divide a memory finger portion into two separately programmable (read/write) pages. While erase operation of a 3D NAND memory can be carried out at memory block level, read and write operations can be carried out at memory page level. In some embodiments, dummy channel structures 222 can be disposed at suitable places for process variation control during fabrication and/or for additional mechanical support.

It is noted that, in some examples, the top select gate cuts 215 do not cut the memory cell gate layers and the bottom select gate layers.

In the TSG connection region 261, a stair structure is formed. The stair structure has multiple stair steps to expose a portion of gate layers of the top select transistors, and the exposed portions can be configured as contact pads. Then, contact structures can be formed on the contact pads for connecting metal wires to the gates of the top select transistors to control the top select transistors. In the FIGS. 2-5 example, and shown in FIG. 4, the stair structure at the TSG connection region 261 has two stair steps 262 and 263. In an example, each of the two stair steps 262 and 263 has a height of one layer pair. In the FIG. 2-5 example, the dashed lines show edges of treads. In an example, a memory string includes a first gate select transistor and a second gate select transistor. The gate of the first gate select transistor is connected with a contact structure 264 on the first stair step 262, and the gate of the second gate select transistor is connected with a contact structure 265 on the second stair step 263.

Details of the first staircase section 270 are shown in FIG. 4. The first staircase section 270 exposes a portion of gate layers to the memory cells M1-M54 in each memory string 251 as contact pads, and contact structures can be formed on the contact pads to connect the gate layers of the memory cells M1-M54 in each memory string 251 to word lines.

For example, the tread of division stair step D6 in the region of group stair step G9 provides contact pad for M1. The tread of division stair step D5 in the region of group stair step G9 provides contact pad for M2. The tread of division stair step D4 in the region of group stair step G9 provides contact pad for M3. The tread of division stair step D3 in the region of group stair step G9 provides contact pad for M4. The tread of division stair step D2 in the region of group stair step G9 provides contact pad for M5. The tread of division stair step D1 in the region of group stair step G9 provides contact pad for M6.

Similarly, the tread of division stair step D6 in the region of group stair step G8 provides contact pad for M7. The tread of division stair step D5 in the region of group stair step G8 provides contact pad for M8. The tread of division stair step D4 in the region of group stair step G8 provides contact pad for M9. The tread of division stair step D3 in the region of group stair step G8 provides contact pad for M10. The tread of division stair step D2 in the region of group stair step G8 provides contact pad for M11. The tread of division stair step D1 in the region of group stair step G8 provides contact pad for M12.

Similarly, the tread of division stair step D6 in the region of group stair step G7 provides contact pad for M13. The tread of division stair step D5 in the region of group stair step G7 provides contact pad for M14. The tread of division stair step D4 in the region of group stair step G7 provides contact pad for M15. The tread of division stair step D3 in the region of group stair step G7 provides contact pad for M16. The tread of division stair step D2 in the region of group stair step G7 provides contact pad for M17. The tread of division stair step D1 in the region of group stair step G7 provides contact pad for M18.

Similarly, the tread of division stair step D6 in the region of group stair step G6 provides contact pad for M19. The tread of division stair step D5 in the region of group stair step G6 provides contact pad for M20. The tread of division stair step D4 in the region of group stair step G6 provides contact pad for M21. The tread of division stair step D3 in the region of group stair step G6 provides contact pad for M22. The tread of division stair step D2 in the region of group stair step G6 provides contact pad for M23. The tread of division stair step D1 in the region of group stair step G6 provides contact pad for M24.

Similarly, the tread of division stair step D6 in the region of group stair step G5 provides contact pad for M25. The tread of division stair step D5 in the region of group stair step G5 provides contact pad for M26. The tread of division stair step D4 in the region of group stair step G5 provides contact pad for M27. The tread of division stair step D3 in the region of group stair step G5 provides contact pad for M28. The tread of division stair step D2 in the region of group stair step G5 provides contact pad for M29. The tread of division stair step D1 in the region of group stair step G5 provides contact pad for M30.

Similarly, the tread of division stair step D6 in the region of group stair step G4 provides contact pad for M31. The tread of division stair step D5 in the region of group stair step G4 provides contact pad for M32. The tread of division stair step D4 in the region of group stair step G4 provides contact pad for M33. The tread of division stair step D3 in the region of group stair step G4 provides contact pad for M34. The tread of division stair step D2 in the region of group stair step G4 provides contact pad for M35. The tread of division stair step D1 in the region of group stair step G4 provides contact pad for M36.

Similarly, the tread of division stair step D6 in the region of group stair step G3 provides contact pad for M37. The tread of division stair step D5 in the region of group stair step G3 provides contact pad for M38. The tread of division stair step D4 in the region of group stair step G3 provides contact pad for M39. The tread of division stair step D3 in the region of group stair step G3 provides contact pad for M40. The tread of division stair step D2 in the region of group stair step G3 provides contact pad for M41. The tread of division stair step D1 in the region of group stair step G3 provides contact pad for M42.

Similarly, the tread of division stair step D6 in the region of group stair step G2 provides contact pad for M43. The tread of division stair step D5 in the region of group stair step G2 provides contact pad for M44. The tread of division stair step D4 in the region of group stair step G2 provides contact pad for M45. The tread of division stair step D3 in the region of group stair step G2 provides contact pad for M46. The tread of division stair step D2 in the region of group stair step G2 provides contact pad for M47. The tread of division stair step D1 in the region of group stair step G2 provides contact pad for M48.

Similarly, the tread of division stair step D6 in the region of group stair step G1 provides contact pad for M49, and a contact structure C1 (shown in FIG. 5) is formed on the contact pad. The tread of division stair step D5 in the region of group stair step G1 provides contact pad for M50, and a contact structure C2 (shown in FIG. 5) is formed on the contact pad. The tread of division stair step D4 in the region of group stair step G1 provides contact pad for M51, and a contact structure C3 (shown in FIG. 5) is formed on the contact pad. The tread of division stair step D3 in the region of group stair step G1 provides contact pad for M52, and a contact structure C4 (shown in FIG. 5) is formed on the contact pad. The tread of division stair step D2 in the region of group stair step G1 provides contact pad for M53, and a contact structure C5 (shown in FIG. 5) is formed on the contact pad. The tread of division stair step D1 in the region of group stair step G1 provides contact pad for M54, and a contact structure C6 (shown in FIG. 5) is formed on the contact pad.

It is noted that, in some examples, slit structures, such as shown by the slit structures 211, 212(B), 213(B) and 214 in FIG. 5 are filled with an insulating layer 530, and a conductive material 540. The insulating layer 530 insulates the conductive material 540 from the gate layers. The conductive material 540 can be used for forming common source contact.

Figure 6:
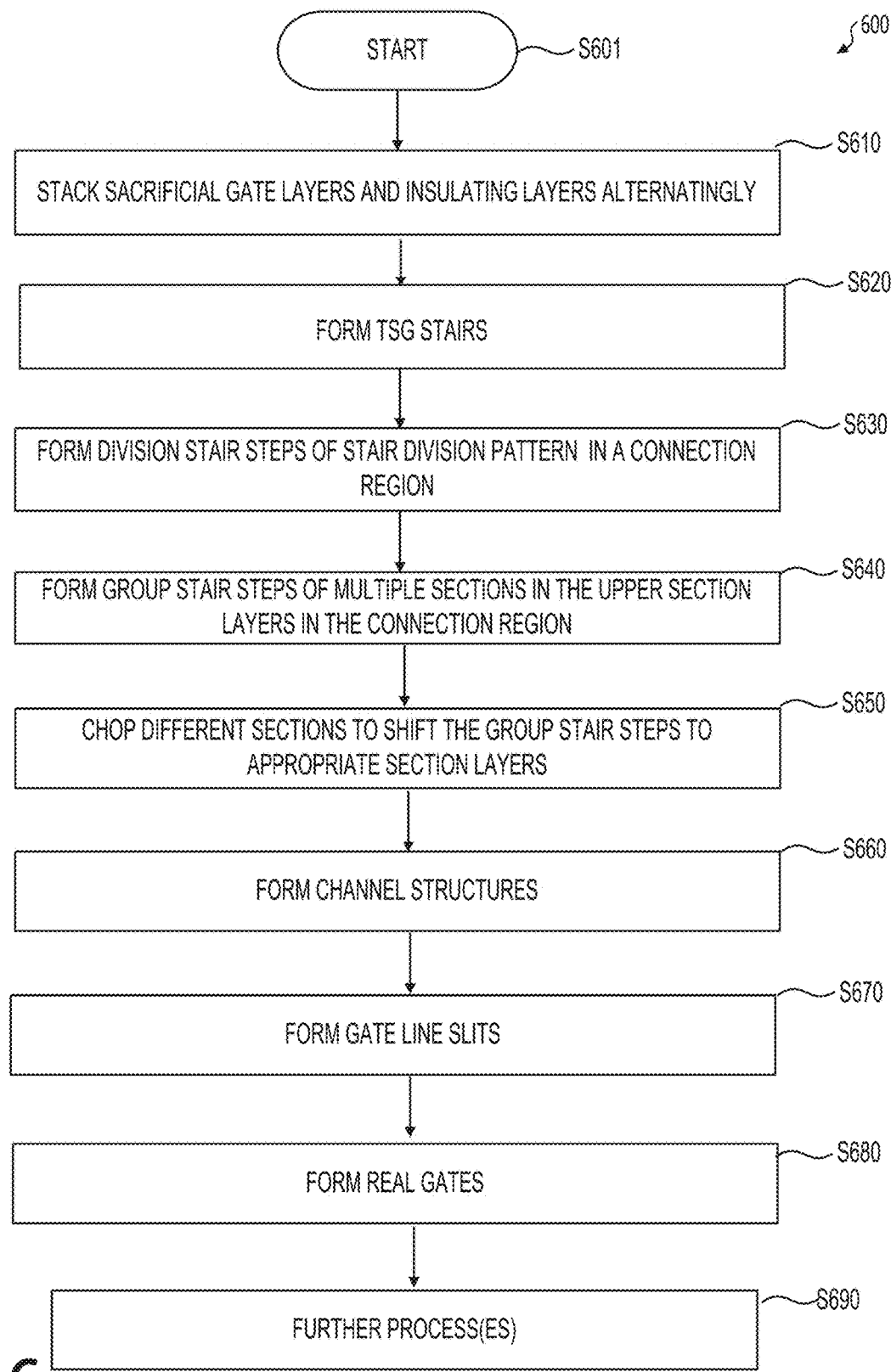
FIG. 6 shows a flow chart outlining a process example for fabricating a semiconductor device according to some embodiments of the disclosure.

FIG. 6 shows a flow chart outlining a process example 600 for fabricating a semiconductor device, such as the semiconductor device 100 according to some embodiments of the disclosure. The process starts at S601 and proceeds to S610.

At S610, sacrificial gate layers and insulating layers are stacked alternatingly on a substrate to form an initial stack. The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer. In some examples, the insulating layers are made of insulating material(s), such as silicon dioxide, and the like, and the sacrificial layers are made of silicon nitride.

At S620, stair steps to gates of the top select transistors are formed. The stair steps to the gates of the top select transistors can be formed by any suitable process. In an example, the stair steps to the gates of the top select transistors can be formed by applying a repetitive etch-trim process using a mask layer. The details of a repetitive etch-trim process will be described with reference to S630.

Figure 7:
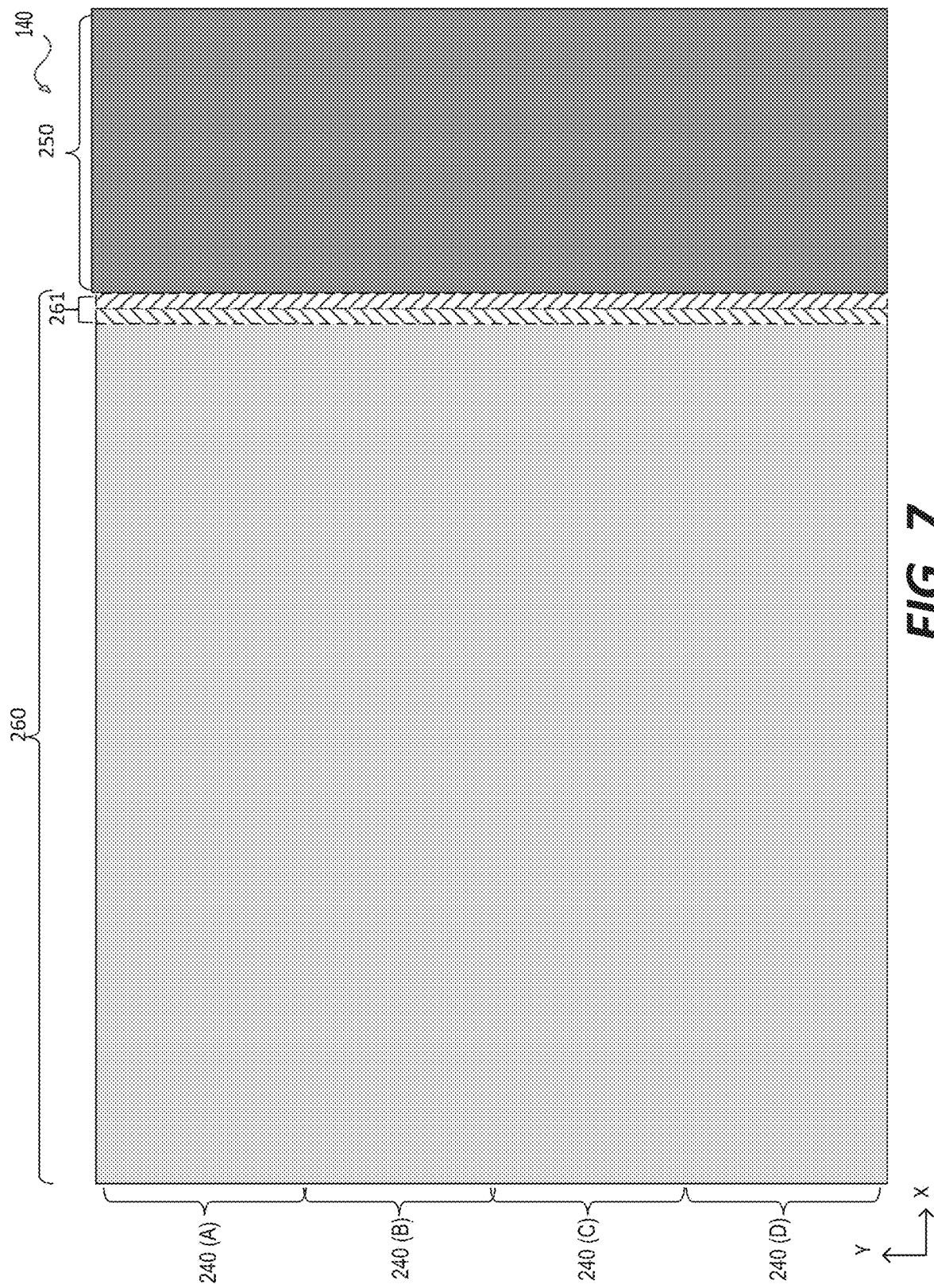
FIG. 7 shows an example of a top-down view of the block portion of the semiconductor device during fabrication according to some embodiments of the disclosure.

FIG. 7 shows an example of a top-down view of the block portion 140 of the semiconductor device 100 after the formation of the stair steps to the gates of the top select transistors. As shown in FIG. 7, stair steps are formed in the TSG connection region 261.

Referring back to FIG. 6, at S630, division stair steps of stair division patterns are formed in a connection region. In some examples, a mask layer is used and trimming process is applied on the mask layer to form the etch masks for forming the division stair steps.

Figure 8:
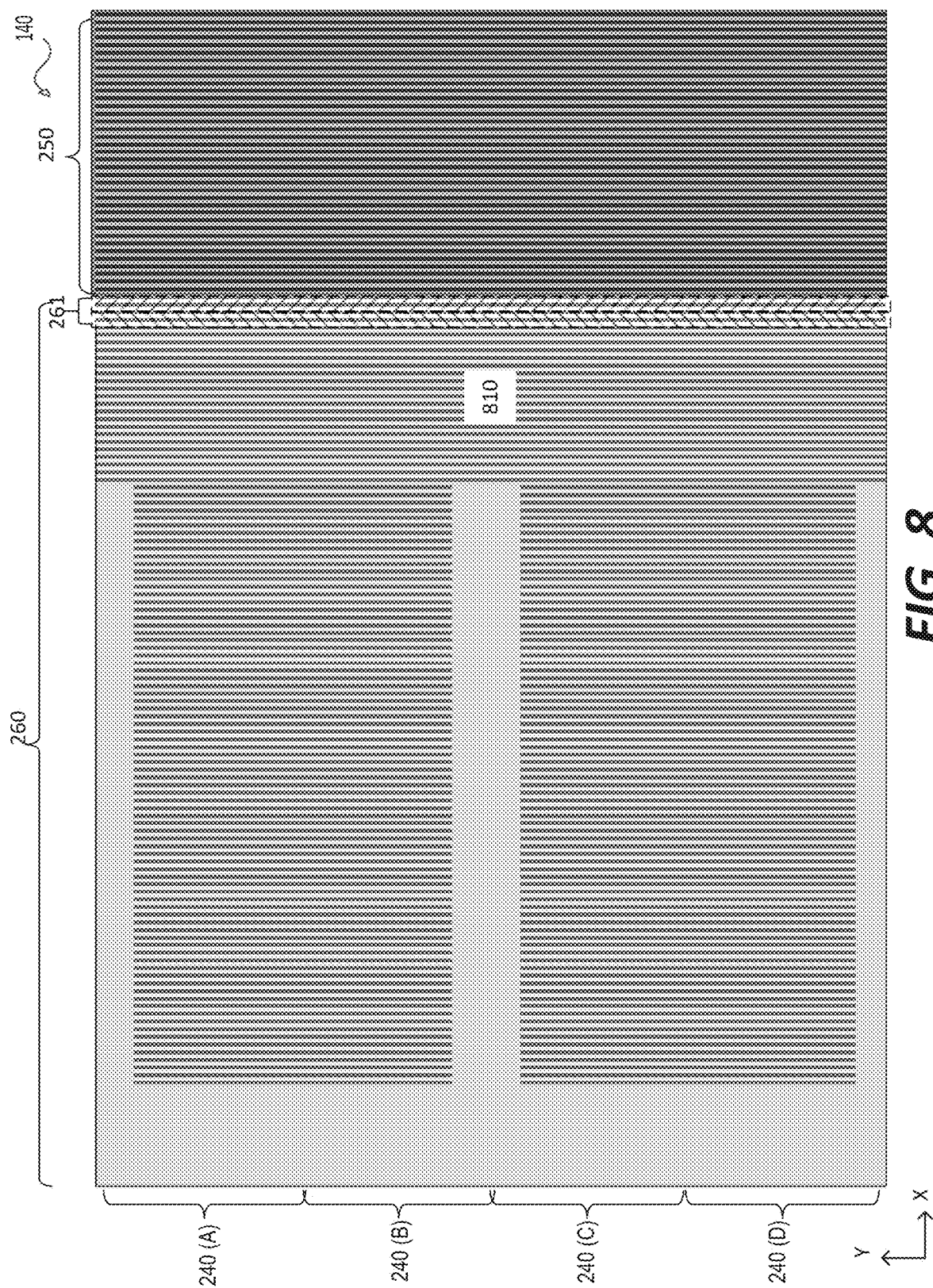
FIG. 8 shows an example of a top-down view of the block portion of the semiconductor device during fabrication according to some embodiments of the disclosure.

FIG. 8 shows an example of top-down view of the block portion 140 of the semiconductor device 100 with SDP portions 240(A)-(D) that are covered by a mask layer 810. The mask layer 810 is used to form the division stair steps in the SDP portions 240(A)-(D). The SDP portions 240(A)-(D) have identical SDP or mirrored SDP. The mask layer 810 covers the array region 250 and a portion of the connection region 260 adjacent to the array region 250 and the TSG connection region 261. In some embodiments, the mask layer 810 can include a photoresist or carbon-based polymer material, and can be formed using a patterning process such as lithography. In some embodiments, the mask layer 810 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using O2 or CF4 chemistry. Furthermore, the mask layer 810 can include any combination of photoresist and hard mask.

In some embodiments, the division stair steps can be formed by applying a repetitive etch-trim process using the mask layer 810. The repetitive etch-trim process includes multiple cycles of an etching process and a trimming process. During the etching process, a portion of the initial stack with exposed surface can be removed. In an example, the etch depth equals to a layer pair that is the thickness of a sacrificial gate layer and an insulating layer. In an example, the etching process for the insulating layer can have a high selectivity over the sacrificial layer, and/or vice versa.

In some embodiments, the etching of the stack is performed by an anisotropic etching such as a reactive ion etch (RIE) or other dry etch processes. In some embodiments, the insulating layer is silicon oxide. In this example, the etching of silicon oxide can include RIE using fluorine based gases such as carbon-fluorine (CF4), hexafluoroethane (C2F6), CHF3, or C3F6 and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

The trimming process includes applying a suitable etching process (e.g., an isotropic dry etch or a wet etch) on the mask layer 810 such that the mask layer 810 can be pulled back (e.g., shrink inwardly) laterally in the x-y plane from edges. In some embodiments, the trimming process can include dry etching, such as RIE using O2, Ar, N2, etc. In some embodiments, a pull-back distance of the mask layer 810 corresponds to the depth of a division stair step.

After trimming the mask layer 810, one portion of the topmost level of the initial stack corresponding to a division is exposed and the other portion of the topmost level of the initial stack remains covered by the mask layer 810. The next cycle of etch-trim process resumes with the etching process.

In some embodiments, the topmost level of the initial stack can be covered by an insulating layer. In some embodiments, the topmost level of the initial stack can further be covered by other dielectric materials. A process step of removing the insulating layer and/or the other dielectric materials can be added to the etching process of each etch-trim cycle to form the division stair steps.

After forming the division stair steps, the mask layer 810 can be removed. The mask layer 810 can be removed by using techniques such as dry etching with O2 or CF4 plasma, or wet etching with resist/polymer stripper, for example solvent based chemicals.

Figure 9:
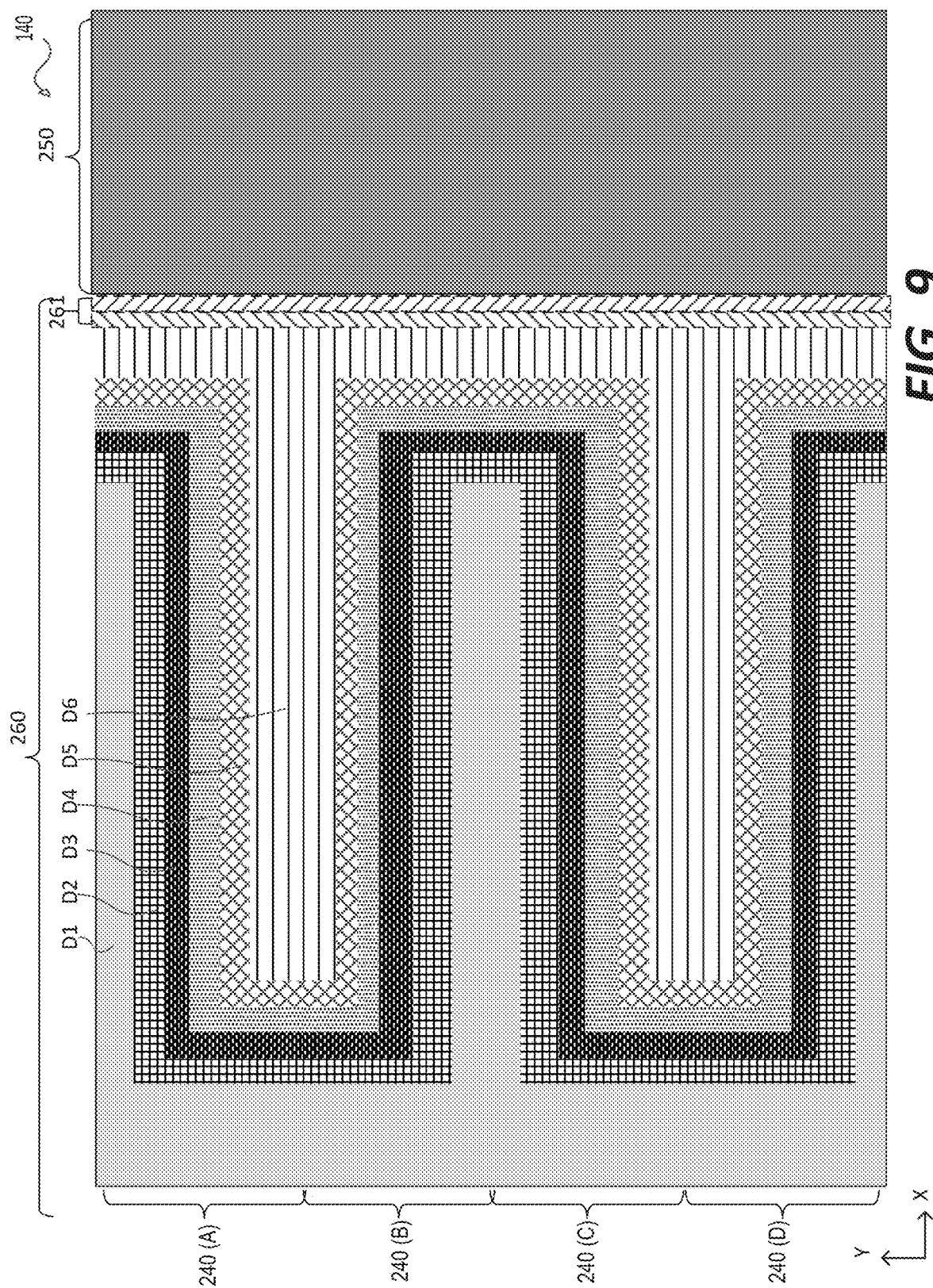
FIG. 9 shows an example of a top-down view of the block portion of the semiconductor device during fabrication according to some embodiments of the disclosure.

FIG. 9 shows an example of top-down view of the block portion 140 in the semiconductor device 100 after the mask layer 810 is removed. As shown in FIG. 9, division stair steps D1-D6 are formed.

Referring back to FIG. 6, at S640, group stair steps for the multiple staircase sections, such as the first staircase section 270, the second staircase section 290 and the like, in the connection region are formed in the upper section layers, such as the layers for M1-M54. In some examples, a mask layer is used, and trimming process is applied on the mask layer to form the etch masks for forming the group stair steps.

Figure 10:
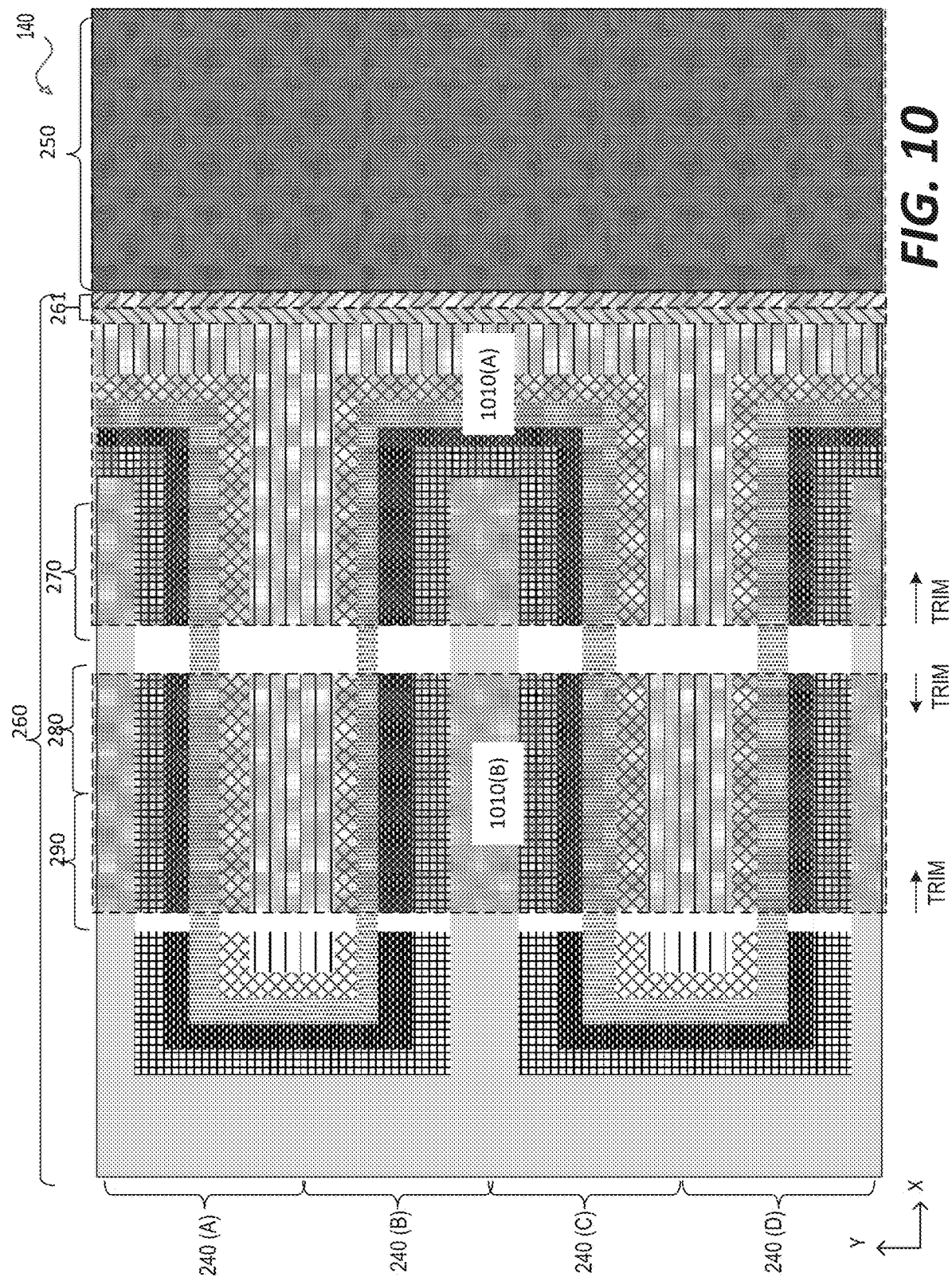
FIG. 10 shows an example of a top-down view of the block portion of the semiconductor device during fabrication according to some embodiments of the disclosure.

FIG. 10 shows an example of top-down view of the block portion 140 of the semiconductor device 100 that is covered by a mask layer 1010 that is used to form the group stair steps. The mask layer 1010 is disposed over the array region 250 and a portion of the connection region 260. As shown in FIG. 10, the mask layer 1010 has a first portion 1010(A) and a second portion 1010(B). The first portion 1010(A) covers the array region 250 and a portion of the first staircase section 270, the second portion 1010(B) covers a portion of the second staircase section 290 and a portion of the dummy staircase section 280. The mask layer 1010 can be made of a similar material as the mask layer 810 and can be formed using a similar technique.

In some embodiments, the group stair steps can be formed by applying repetitive etch-trim process using the mask layer 1010, similar to the repetitive etch-trim process to form the division stair steps. In this example, the group stair steps of the first staircase section 270 can be formed by trimming the left edge of the first portion 1010(A) in X direction. The group stair steps of the second staircase section 290 can be formed by trimming the left edge of the second portion 1010(B) in X direction. The group stair steps of the dummy staircase section 280 can be formed by trimming the right edge of the second portion 1010(B) in –X direction.

In some embodiments, each group stair step includes multiple layer pairs, such as 9 layer pairs in an example. Then, an etching process etches suitable layers corresponding to the height of a group stair step, such as nine layer pairs of alternating sacrificial layers and insulating layers.

After forming the group stair steps, the mask layer 1010 can be removed. The mask layer 1010 can be removed by using techniques such as dry etching with O2 or CF4 plasma, or wet etching with resist/polymer stripper, for example solvent based chemicals.

Figure 11:
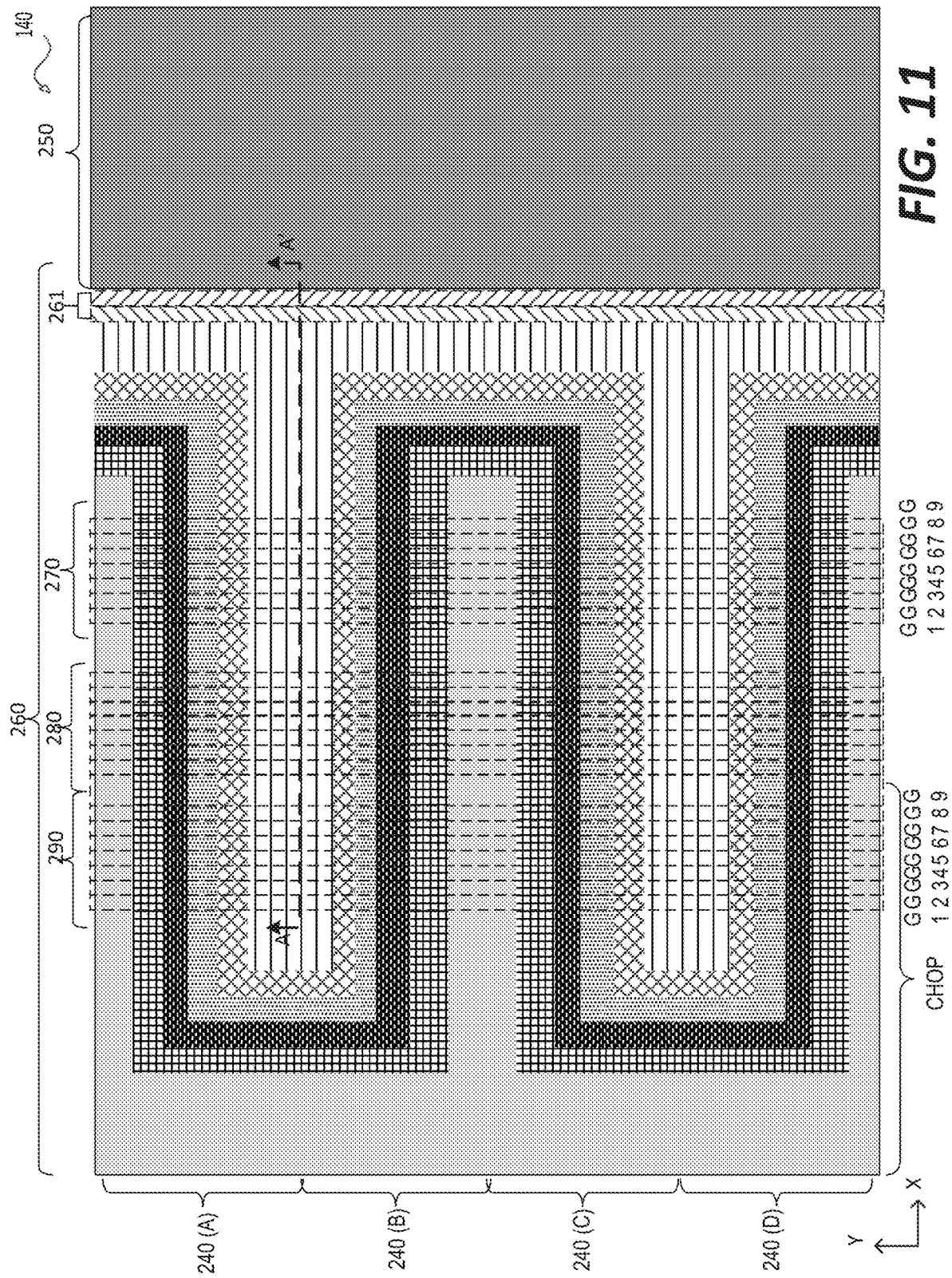
FIG. 11 shows an example of a top-down view of the block portion of the semiconductor device during fabrication according to some embodiments of the disclosure.

FIG. 11 shows an example of top-down view of the block portion 140 in the semiconductor device 100 after the mask layer 1010 is removed. The dashed lines show the edges of treads for the group stair steps. As shown in FIG. 11, group stair steps G1-G9 are formed.

Figure 12:
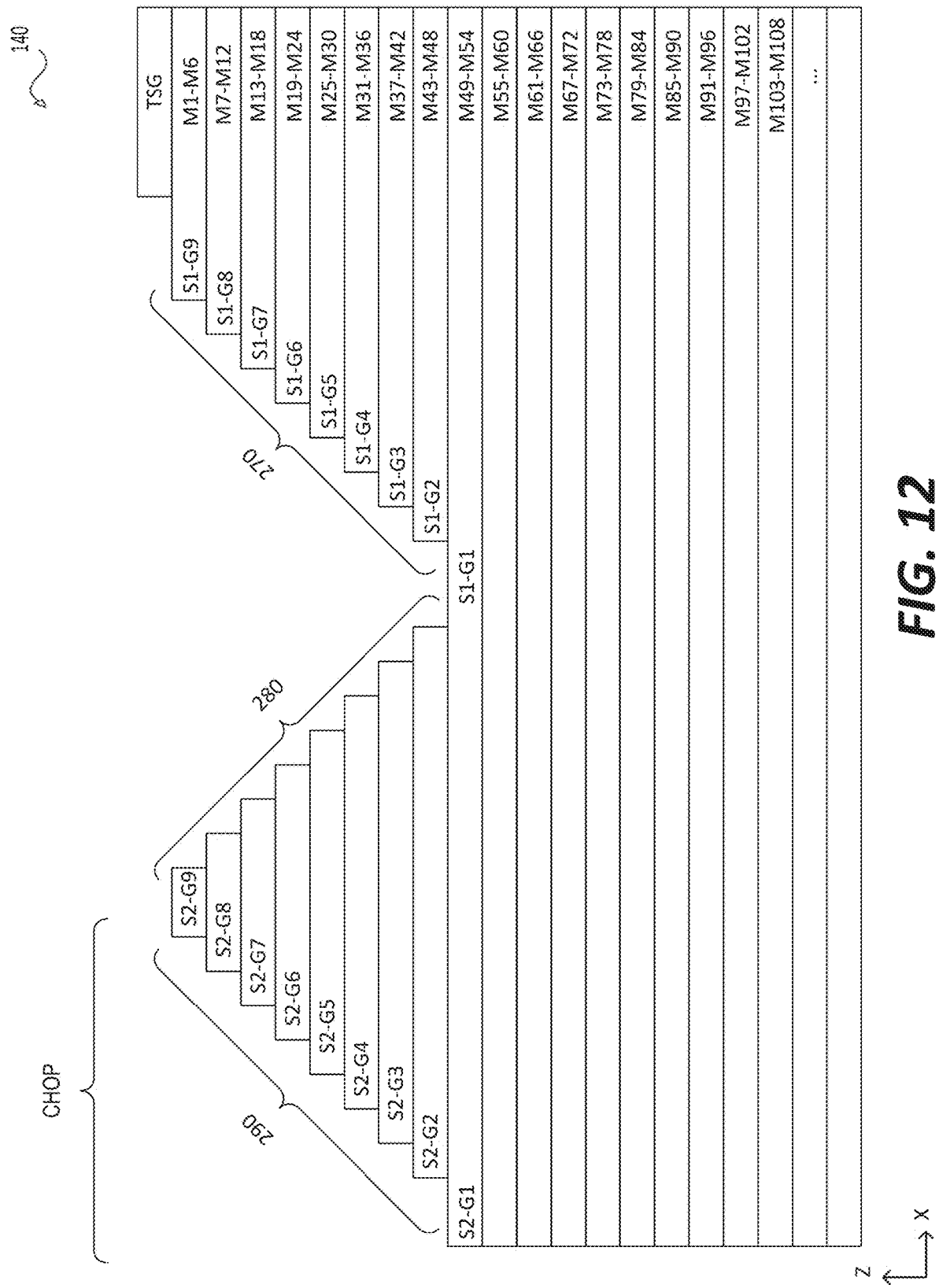
FIG. 12 shows an example of a cross-sectional view of the block portion of the semiconductor device during fabrication according to some embodiments of the disclosure.
Figure 13:
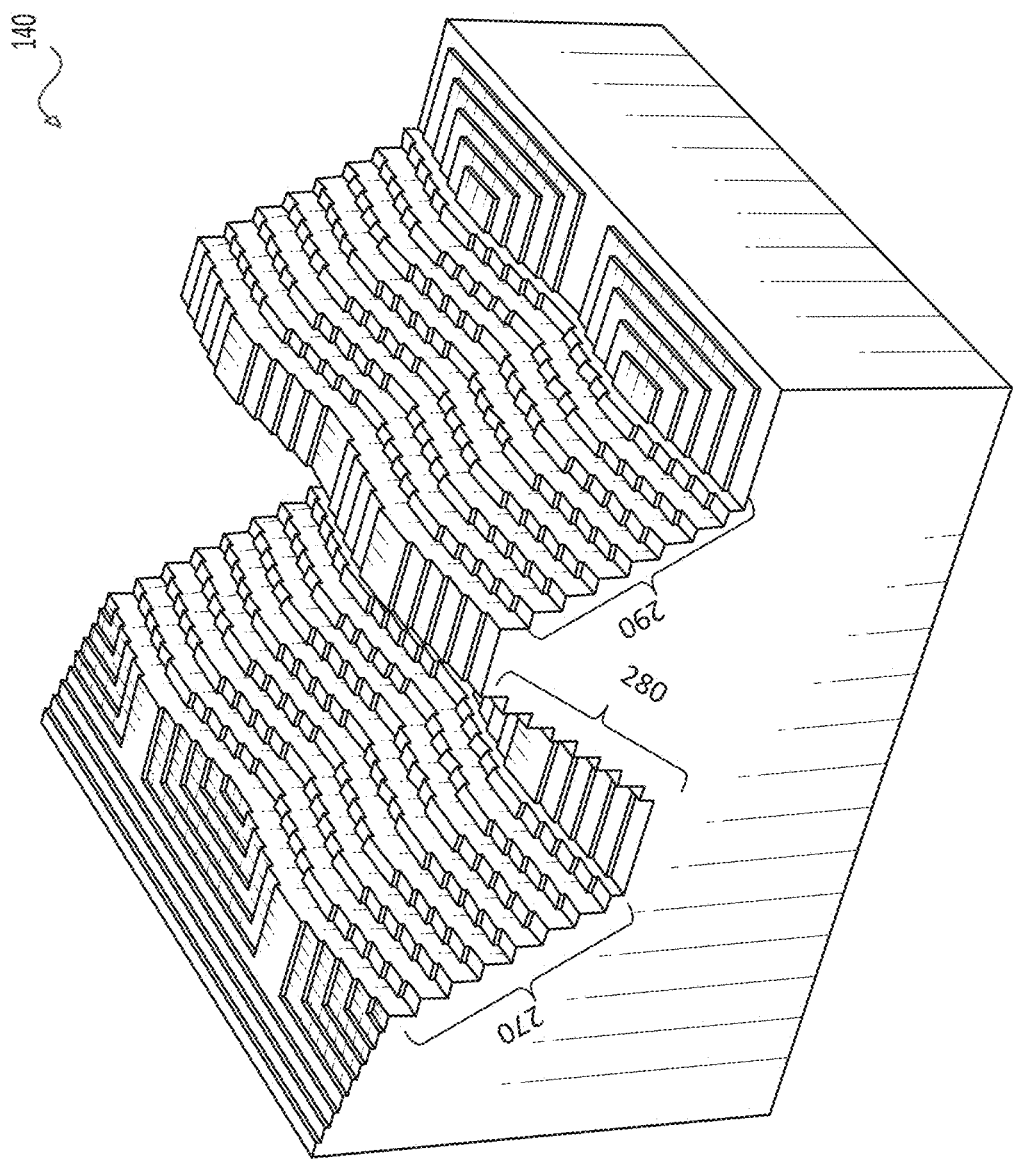
FIG. 13 shows an example of a perspective view of the block portion of the semiconductor device during fabrication according to some embodiments of the disclosure.

FIG. 12 shows an example of a cross-sectional view of the block portion 140 at line A-A' after the mask layer 1010 is removed. FIG. 13 shows a perspective view of the block portion 140 after the mask layer 1010 is removed. As shown in FIG. 12 and FIG. 13, group stair steps G1-G9 of the first staircase section 270 and the second staircase section 290 are formed in the layers for M1-M54.

Referring back to FIG. 6, at S650, a chop process is performed at different staircase sections to shift the staircase sections to the appropriate section layers. In an example, the second staircase section 290 is suitably exposed, and a chop process is performed to shift the second staircase section 290 to the layers for M55-M108. For example, a mask layer is disposed to cover the semiconductor device 100, and then the portion of the mask layer that covers the second staircase section 290 is suitably removed to expose the second staircase section 290. Then, etch process is performed to remove 54 layer pairs at the second staircase section 290.

In some embodiments, the etching of a lay pair (including an insulating layer and a sacrificial gate layer) at the second staircase section 290 is performed by an anisotropic etching such as a reactive ion etch (RIE) or other dry etch processes. In some embodiments, the insulating layer is silicon oxide. In this example, the etching of silicon oxide can include RIE using fluorine based gases such as carbon-fluorine (CF4), hexafluoroethane (C2F6), CHF3, or C3F6 and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial gate layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

Figure 14:
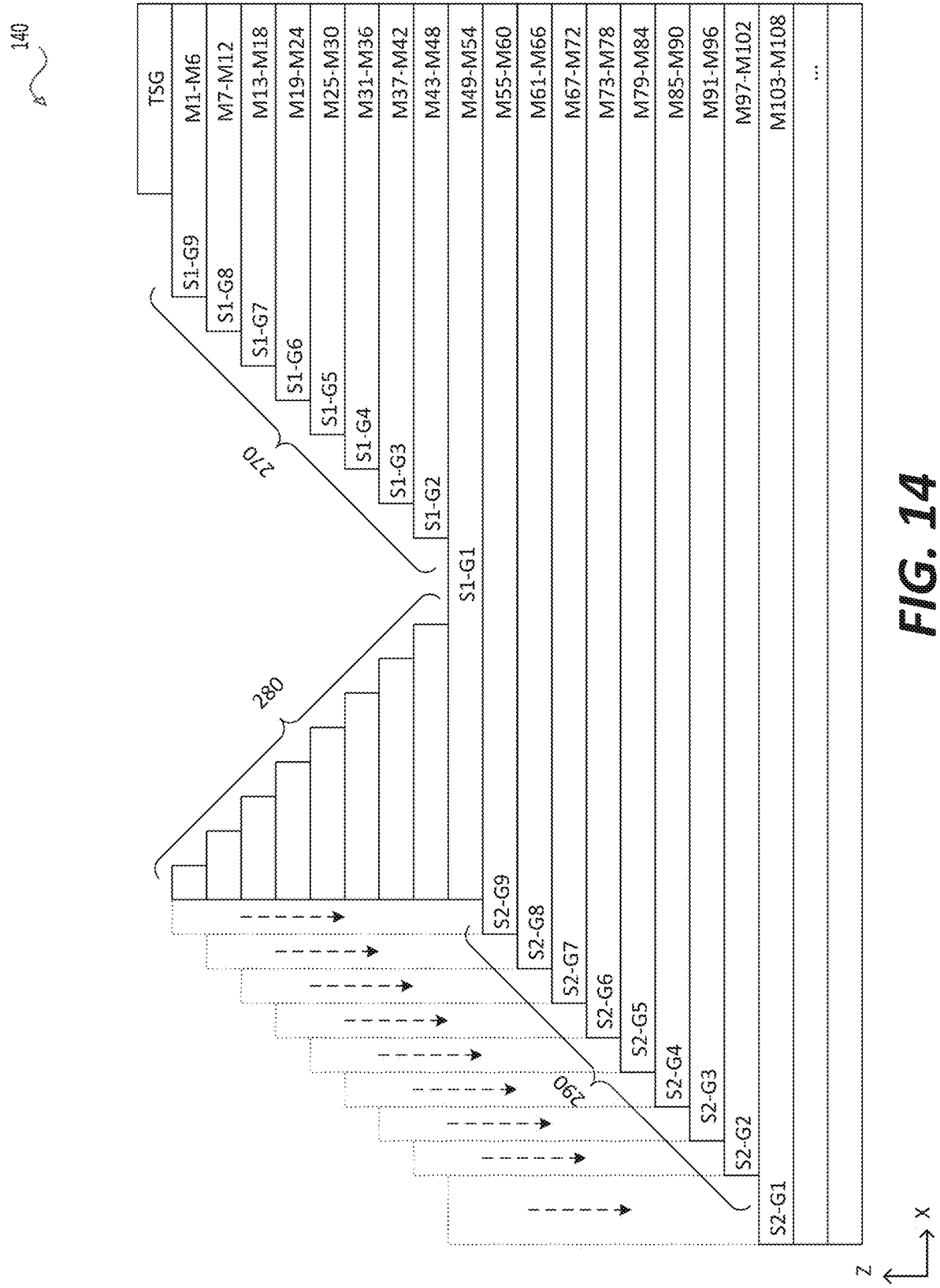
FIG. 14 shows an example of a cross-sectional view of the block portion of the semiconductor device during fabrication according to some embodiments of the disclosure.
Figure 15:
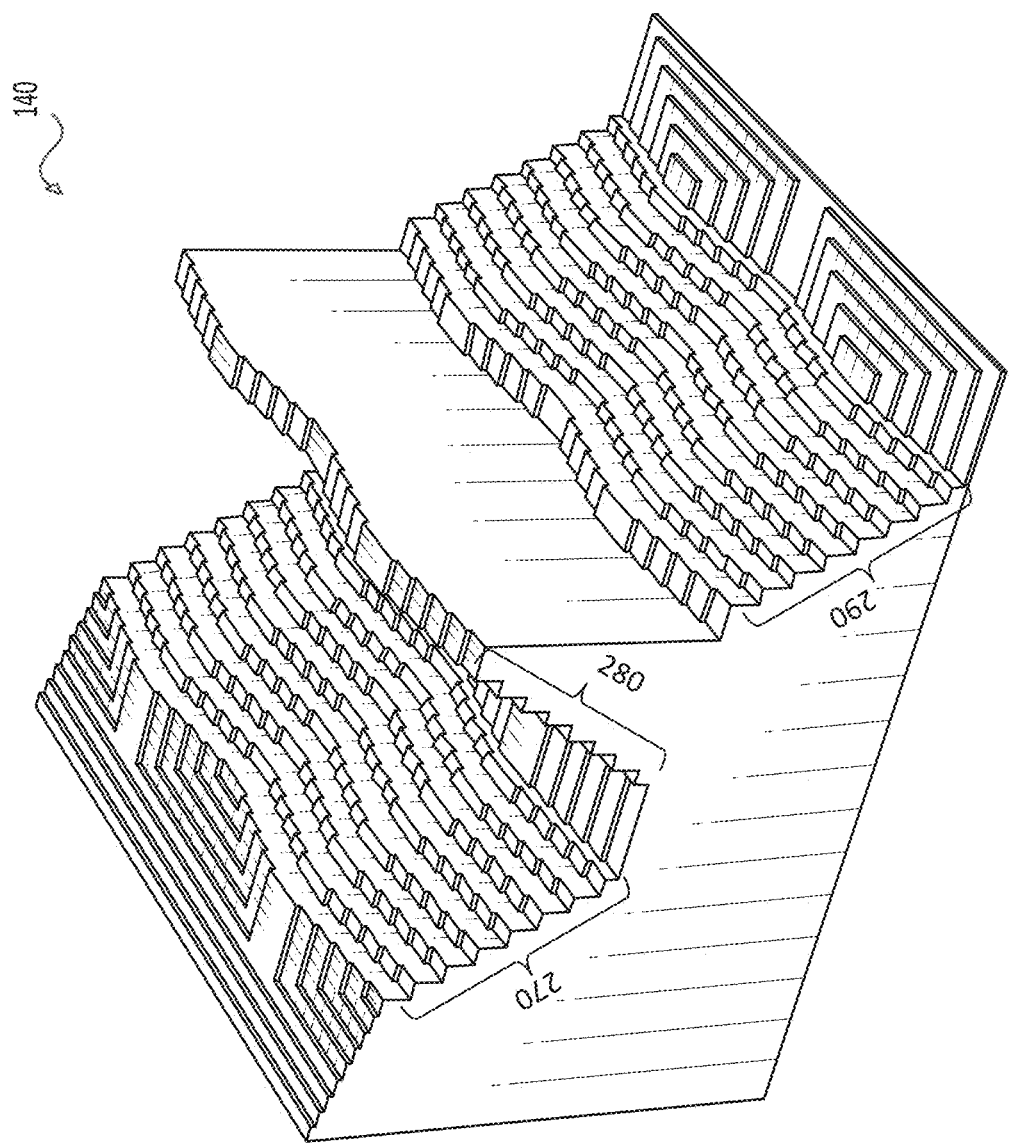
FIG. 15 shows an example of a perspective view of the block portion of the semiconductor device during fabrication according to some embodiments of the disclosure.

FIG. 14 shows an example of a cross-sectional view of the block portion 140 at line A-A' after the chop process and the mask layer is removed. FIG. 15 shows a perspective view of the block portion 140 after the chop process and the mask layer is removed. As shown in FIG. 14 and FIG. 15, group stair steps G1-G9 of the second staircase section 290 are shifted in the layers for M55-M108.

It is noted that, when more than two sections are used, the chop process can be repetitively used on other sections.

Referring back to FIG. 6, at S660, channel structures are formed. In an example, suitably planarization process is performed to obtain a relatively flat surface. Then, photo lithography technology is used to define patterns of channel holes and dummy channel holes in photoresist and/or hard mask layers, and etch technology is used to transfer the patterns into the stack of sacrificial layers and insulating layers. Thus, channel holes are formed in the array region 250 and the dummy channel holes are formed in the connection region.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures.

At S670, gate line slits (also referred to as slit structures in some examples) are formed. In some embodiments, the gate line slits are etched as trenches in the stack. In some examples, the gate line slits in the connection region have the same pitch as the gate line slits in the array region.

At S680, real gates are formed. In some embodiments, using the gate line slits, the sacrificial layers can be replaced by the gate layers. In an example, etchants to the sacrificial layers are applied via the gate line slits to remove the sacrificially layers. In an example, the sacrificial layers are made of silicon nitride, and the hot sulfuric acid ($H_2SO_4$) is applied via the gate line slits to remove the sacrificial layers. Further, via the gate line slits, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, $W_2N$, TiSiN, TaSiN, and the like. The metal layer includes a metal having high conductivity, such as tungsten (W), copper (Cu) and the like.

At S690, further process(es) can be performed on the semiconductor device. For example, the gate-last process continues to, for example, fill the gate line slits with spacer material (e.g., silicon oxide) and common source material (e.g., tungsten) to form the slit structure. Further, contacts structures can be formed and metal traces can be formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a stack including gate layers and insulating layers alternately stacked along a first direction;
channel structures located in an array region of the stack;
a first staircase located at a first section in a connection region of the stack, the connection region and the array region arranged in a second direction perpendicular to the first direction;
a second staircase located at a second section in the connection region of the stack; and
an intermediate staircase located at the first section and disposed between the first staircase and the second staircase in the second direction, the intermediate staircase including intermediate group stair steps ascending in the second direction,
wherein the intermediate staircase has a first sidewall and a second sidewall in the second direction, and the second sidewall is closer to the second staircase than the first sidewall; and
wherein the second sidewall is parallel to the first direction, and the intermediate group stair steps of the intermediate staircase face the first staircase.

2. The semiconductor device of claim 1, wherein:
the first staircase is positioned over the second staircase in the first direction and includes first group stair steps descending in the second direction; and
the second staircase includes second group stair steps descending in the second direction.

3. The semiconductor device of claim 2, wherein:
the first staircase further includes first division stair steps descending in a third direction and a fourth direction that are perpendicular to the second direction and the first direction and opposite to each other;
the second staircase further includes second division stair steps descending in the third direction and the fourth direction; and
the intermediate staircase further includes third division stair steps descending in the third direction and the fourth direction.

4. The semiconductor device of claim 3, wherein:
a height difference of two consecutive first group stair steps of the first group stair steps in the first direction is equal to a height of N pairs of the gate layers and the insulating layers in the first section, and
a height difference of two consecutive first division stair steps of the first division stair steps in the first direction is equal to a height of one pair of the gate layer and the insulating layer in the first section, the N being greater than one.

5. The semiconductor device of claim 3, wherein:
a height difference of two consecutive second group stair steps of the second group stair steps in the first direction is equal to a height of N pairs of the gate layers and the insulating layers in the second section, and
a height difference of two consecutive second division stair steps of the second division stair steps in the first direction is equal to a height of one pair of the gate layer and the insulating layer in the second section.

6. The semiconductor device of claim 1, wherein:
the intermediate staircase has a same height as the first staircase in the first direction and is positioned over the second staircase in the first direction.

7. The semiconductor device of claim 1, wherein a height difference of two consecutive intermediate group stair steps of the intermediate group stair steps in the first direction is equal to a height of N pairs of the gate layers and the insulating layers in the first section.

8. The semiconductor device of claim 1, wherein the first section in the connection region of the stack and the second section in the connection region of the stack have a same number of gate layers.

9. The semiconductor device of claim 1, further comprising:
contact structures located on the first staircase and the second staircase but not located on the intermediate staircase.

10. The semiconductor device of claim 9, wherein the contact structures further comprises:
first contact structures located on the first staircase and connected to the gate layers at the first section in the connection region of the stack; and
second contact structures located on the second staircase and connected to the gate layers at the second section in the connection region of the stack.

11. A semiconductor device, comprising:
a stack including gate layers and insulating layers alternately stacked along a first direction;
channel structures located in an array region of the stack;
a first staircase located at a first section in a connection region of the stack, the connection region and the array region being arranged in a second direction perpendicular to the first direction, the first staircase including first group stair steps descending in the second direction;
a second staircase located at a second section in the connection region of the stack; and
a intermediate staircase located at the first section and disposed between the first staircase and the second staircase in the second direction, the intermediate staircase including intermediate group stair steps ascending in the second direction.

12. The semiconductor device of claim 11, wherein:
the first staircase is positioned over the second staircase in the first direction and includes first group stair steps descending in the second direction; and
the second staircase includes second group stair steps descending in the second direction.

13. The semiconductor device of claim 12, wherein:
the first staircase further includes first division stair steps descending in a third direction and a fourth direction that are perpendicular to the second direction and the first direction and opposite to each other;
the second staircase further includes second division stair steps descending in the third direction and the fourth direction; and
the intermediate staircase further includes third division stair steps descending in the third direction and the fourth direction.

14. The semiconductor device of claim 13, wherein:
a height difference of two consecutive first group stair steps of the first group stair steps in the first direction is equal to a height of N pairs of the gate layers and the insulating layers in the first section;
a height difference of two consecutive first division stair steps of the first division stair steps in the first direction is equal to a height of one pair of the gate layer and the insulating layer in the first section, the N being greater than one;

a height difference of two consecutive second group stair steps of the second group stair steps in the first direction is equal to a height of N pairs of the gate layers and the insulating layers in the second section; and a height difference of two consecutive second division stair steps of the second division stair steps in the first direction is equal to a height of one pair of the gate layer and the insulating layer in the second section.

15. The semiconductor device of claim 1, wherein:
the intermediate staircase has a same height as the first staircase and is positioned over the second staircase in the first direction.

16. The semiconductor device of claim 11, wherein a height difference of two consecutive intermediate group stair steps of the intermediate group stair steps in the first direction is equal to a height of N pairs of the gate layers and the insulating layers in the first section.

17. The semiconductor device of claim 1, further comprises:

first contact structures located on the first staircase, the first contact structures being connected to the gate layers at the first section in the connection region of the stack; and second contact structures located on the second staircase and connected to the gate layers at the second section in the connection region of the stack.

18. A semiconductor device, comprising:
a stack including gate layers and insulating layers alternately stacked along a first direction;
channel structures located in an array region of the stack;
a first staircase located at a first section in a connection region of the stack, the connection region and the array region being arranged in a second direction perpendicular to the first direction; and
a second staircase located at a second section in the connection region of the stack;
wherein the first staircase further includes first division stair steps descending in a third direction and a fourth direction that are perpendicular to the second direction and the first direction and opposite to each other; and
wherein the second staircase further includes second division stair steps descending in the third direction and the fourth direction.

19. The semiconductor device of claim 18, further comprises:
a intermediate staircase located at the first section and disposed between the first staircase and the second staircase in the second direction,
wherein the intermediate staircase includes intermediate group stair steps ascending in the second direction, and the intermediate staircase further includes third division stair steps descending in the third direction and the fourth direction.

20. The semiconductor device of claim 19, further comprising:
contact structures located on the first staircase and the second staircase but not located on the intermediate staircase, the contact structures including first contact structures and second contact structures,
wherein the first contact structures are located on the first staircase and connected to the gate layers at the first section in the connection region of the stack; and
wherein the second contact structures are located on the second staircase and connected to the gate layers at the second section in the connection region of the stack.

* * * * *